United States Patent
Izumi et al.

(10) Patent No.: US 6,770,978 B2
(45) Date of Patent: Aug. 3, 2004

(54) METAL LINE, METHOD FOR FABRICATING THE METAL LINE, THIN FILM TRANSISTOR EMPLOYING THE METAL LINE AND DISPLAY DEVICE

(75) Inventors: Yoshihiro Izumi, Kashihara (JP); Yoshimasa Chikama, Kyoto (JP); Satoshi Kawashima, Omiya (JP); Takaharu Hashimoto, Omiya (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/795,832

(22) Filed: Feb. 28, 2001

(65) Prior Publication Data

US 2001/0023771 A1 Sep. 27, 2001

(30) Foreign Application Priority Data

Feb. 29, 2000 (JP) ........................................ 2000-053809

(51) Int. Cl.$^7$ ............................................... H01L 23/48
(52) U.S. Cl. ...................... 257/762; 257/443; 257/750; 257/766
(58) Field of Search ................................ 257/750, 762, 257/766, 443

(56) References Cited

U.S. PATENT DOCUMENTS

| | | | | |
|---|---|---|---|---|
| 4,154,877 A | * | 5/1979 | Vratny | .................. 427/328 |
| 4,970,571 A | * | 11/1990 | Yamakawa et al. | ........... 357/71 |
| 5,342,806 A | * | 8/1994 | Asahina | ...................... 437/195 |
| 6,030,877 A | * | 2/2000 | Lee et al. | ................... 438/381 |
| 6,335,104 B1 | * | 1/2002 | Sambucetti et al. | ........ 428/615 |

FOREIGN PATENT DOCUMENTS

| | | | | |
|---|---|---|---|---|
| JP | 2-83533 | * | 3/1990 | ....... H01L/21/3205 |
| JP | 4-304681 A | * | 10/1992 | ........... H01L/31/10 |

OTHER PUBLICATIONS

M. Ikeda, et al. "Low Resistance Copper Address Line for TFT–LCD". Japan Display '89, pp. 498–501.

* cited by examiner

*Primary Examiner*—T. Thomas
*Assistant Examiner*—Matthew E. Warren
(74) *Attorney, Agent, or Firm*—David G. Conlin; John B. Alexander; Edwards & Angell, LLP

(57) ABSTRACT

There is provided is a metal line structure in which no defect of blistering occurs on a surface of a Cu/Ni film or a Cu/Au/Ni film even if an Ni plating thickness is reduced. According to this metal line 1, in a Cu/Au/Ni film structure in which an Au film 13 and a Cu film 15 are successively laminated by electroless plating on an Ni film 12 formed by electroless plating, the Ni film 12 has a phosphorus content x of 10 wt %$\leq$x$\leq$15 wt %. It was discovered through experiments that the so-called high phosphorus content type Ni film 12 having a phosphorus content x of 10 to 15 percent by weight became a fine smooth film under a condition of a film thickness of 0.1 $\mu$m or greater.

15 Claims, 5 Drawing Sheets

LIGHT

METAL LINE, METHOD FOR FABRICATING THE METAL LINE, THIN FILM TRANSISTOR EMPLOYING THE METAL LINE AND DISPLAY DEVICE

BACKGROUND OF THE INVENTION

The present invention relates to metal lines used for flat panel display devices such as a liquid crystal display (LCD), a field emission display (FED), an electrophoretic display (EPD), a plasma display (PDP), an electrochromic display (ECD) and an electroluminescent display (ELD), a flat panel type image sensor employing an active matrix substrate, a printed wiring board employing a ceramic substrate and metal lines used in a variety of other fields, a method for fabricating the metal lines, a thin film transistor employing the metal lines and a display device.

In a flat panel display represented by the liquid crystal display (LCD), there is adopted a drive system holding a display material such as liquid crystals between a pair of substrates and applying a voltage to this display material. In this case, electric interconnecting lines made of a conductive material are arranged at least on one substrate.

For example, in the case of an active matrix drive type LCD, gate electrodes and data electrodes are arranged in a matrix form on one substrate (active matrix substrate) of a pair of substrates that hold the display material between them, and thin film transistors (TFTs) and pixel electrodes are arranged at the intersections of them. Normally, these gate electrodes and data electrodes are formed of a metal material of tantalum (Ta), aluminum (Al), molybdenum (Mo) or the like and formed into a film by a dry system film forming method such as the sputtering method.

If it is attempted to increase the area and improve the resolution of such a flat panel display, then a drive signal delay emerges as a serious problem due to increased line resistance and parasitic capacitance according as a drive frequency is increased.

Therefore, in order to solve the problem of the drive signal delay, it is tried to use copper (Cu) (bulk resistivity: 1.7 $\mu\Omega\cdot$cm) having a smaller electric resistance for the interconnecting material in place of the conventional interconnecting material of Al (bulk resistivity: 2.7 $\mu\Omega\cdot$cm), $\alpha$-Ta (bulk resistivity: 13.1 $\mu\Omega\cdot$cm) and Mo (bulk resistivity: 5.8 $\mu\Omega\cdot$cm). For example, "Low Resistance Copper Address Line For TFT-LCD" (Japan Display '89 p.498–501) discloses the result of examination of a TFT-LCD that uses Cu as a gate electrode material. According to this reference document, there is a clear statement of the necessity of an improvement in adhesion property by providing a metal film of Ta or the like as a groundwork since a Cu film formed by the sputtering method has a degraded property of adhesion to a foundation glass substrate.

However, the Cu interconnecting line structure has the problems as follows.

That is, when forming both of a Cu film intended for a reduction in resistance and a groundwork metal Ta film intended for an improvement in the adhesion property of the Cu film by the sputtering method or the like by means of a vacuum film forming apparatus, the Cu film and the groundwork metal Ta film need individual film forming processes, and this increases the processes, leading to a cost increase. The Cu film and the groundwork Ta metal film also need individual etching processes, and this increases the processes, leading to a cost increase. Furthermore, the aforementioned Cu interconnecting line structure requires an increase in scale of the vacuum film forming apparatus and the etching apparatus in accordance with an increase in area of the display, i.e., an increase in film forming area, and this disadvantageously causes a production cost increase.

Accordingly, it is demanded to establish a Cu interconnecting line fabricating technique by a wet type plating system technique capable of forming a film at low cost without the need of any vacuum film forming apparatus.

On the other hand, Japanese Patent Laid-Open Publication No. HEI 2-83533 discloses the method of forming a Cu interconnecting line by a plating film forming technique without using any vacuum film forming process such as the sputtering method. In this case, a nickel (Ni) film and a gold (Au) film are successively formed by electroless plating on the groundwork of an ITO (Indium Tin Oxide) film, and a Cu film is further formed on them by electroless plating. With this arrangement, an electric interconnecting line having a Cu/Au/Ni laminate structure is provided.

The above-mentioned forming method is adopted because no sufficient adhesion property can be obtained when it is tried to form a Cu film by plating on a surface of an ITO film (indium tin oxide film) and because it is effective to interpose an Ni film having an excellent property of adhesion to the groundwork before forming the Cu film.

As shown in FIG. 8, if an electroless Cu plating film 102 is provided directly on this electroless Ni film 101, then there occurs the problem that the so-called "blistering" defect of the separation of the Ni film 101 from the interface between the film and a groundwork ITO film 105 provided on a glass substrate 106 as a consequence of the permeation of a Cu plating solution through a pinhole 103 of the Ni film 101 tends to occur.

Accordingly, Japanese Patent Laid-Open Publication No. HEI 2-83533 adopts the method of forming an Ni film to a thickness of not smaller than 0.4 $\mu$m, thereafter forming an Au film to a thickness of not smaller than 0.1 $\mu$m on the surface of the Ni film by displacement plating and finally forming a Cu film to a thickness of not smaller than 0.8 $\mu$m by electroless plating. This method resolves the defect of blistering that occurs after Cu plating by eliminating the pinhole of the Ni film.

According to the construction of Japanese Patent Laid-Open Publication No. HEI 2-83533, the total thickness of the Cu/Au/Ni plating film inevitably becomes 1 $\mu$m or greater, as described hereinabove. According to this Japanese Patent Laid-Open Publication No. HEI 2-83533, there was no limitation on the total thickness of the plating on the precondition that the Cu/Au/Ni plating film was applied to a peripheral terminal portion of a liquid crystal display (LCD), and there was caused no problem if the total thickness of the plating film was formed to a thickness of 1 $\mu$m or greater.

However, if it is tried to apply the aforementioned Cu/Au/Ni plating film to bus lines (signal lines and scanning lines) existing inside the LCD panel of the liquid crystal display (LCD), then there occurs the trouble as follows.

That is, if the bus lines have a difference in level of not smaller than 1 $\mu$m, then the stepped portions sometimes exert a bad influence on the state of alignment of the liquid crystal layer. Furthermore, if there is a device structure in which other interconnecting lines extend across the plating interconnecting lines, then there is an increased probability of the occurrence of the disconnection of the interconnecting lines of the upper layer in the stepped portions.

Therefore, if it is tried to apply the Cu/Au/Ni plating film to the bus lines of the liquid crystal display device, then the total thickness of the plating film should preferably be restrained to a thickness of not greater than 0.5 µm. In the case of the plating interconnecting lines of the Cu/Au/Ni structure, the Cu film dominates the electric performance of the interconnecting lines, whereas the Ni film merely plays the role of securing the property of adhesion to the groundwork. Therefore, if it is tried to reduce the total thickness of the Cu/Au/Ni plating film, then it is important to reduce the thickness of the Ni film in order to maintain the electric characteristics of the interconnecting lines.

However, it is required to set the thickness of the Ni film to a value of not smaller than 0.4 µm in order to solve the defect of blistering as described hereinabove in the case of the metal lines described in the aforementioned Japanese Patent Laid-Open Publication No. 2-83533, and this has been a serious obstacle to the demand of reducing the total plating thickness.

SUMMARY OF THE INVENTION

Accordingly, it is an object of the present invention to provide a metal line structure in which no defect of blistering occurs on the surface of a Cu/Ni films or a Cu/Au/Ni film even if the thickness of a Ni plating film is reduced.

In order to achieve the aforementioned object, the present invention provides a metal line having a plating film structure in which a laminate film of a gold film and a copper film or a copper film is laminated by electroless plating on a nickel film formed by electroless plating, wherein the nickel film has a phosphorus content x of:
10 wt %$\leq$x$\leq$15 wt %, and wherein
the nickel film has a film thickness of 0.1 µm or greater.

The present invention was made on the basis of the following experimental facts.

That is, in the case of the general electroless Ni plating that employs hypophosphite as a reductant, the deposit film generally becomes a eutectoid film of Ni (nickel) and P (phosphorus). However, it was discovered through experiments described later that the so-called high phosphorus content type Ni film having a phosphorus content x of 10 to 15 percent by weight was formed into a fine smooth film under the condition of a film thickness of not smaller than 0.1 µm. This is presumably ascribed to the fact that the Ni film is deposited in an amorphous state when the phosphorus content becomes equal to or greater than eight percent by weight and consequently pinholes are hard to occur at the crystal grain boundaries. It is to be noted that the film quality is not good when the film thickness is smaller than 0.1 µm since the sparse state of the Ni film becomes significant.

Then, no defect of blistering as observed in the conventional case occurred on the obtained Ni film even if the Cu film or the Cu/Au film was formed on the Ni film.

Therefore, employing the Ni film of the present structure enabled the formation of a plating film of the Cu/Ni structure or the Cu/Au/Ni structure with the Ni film of a thickness smaller than 0.4 µm and facilitated the reduction in the total plating thickness.

In a metal line of one embodiment, the gold film has a thickness y of 0.005 µm$\leq$y$\leq$0.05 µm.

This embodiment, which employs the high phosphorus content type Ni film, can obtain a fine Ni film having a smooth surface. Therefore, the Au film to be formed on this Ni film was reduced in thickness to a minimum of 0.005 µm. It is otherwise possible to set the Au film to a thickness of not smaller than 0.05 µm taking a process margin into consideration. However, taking the cost of an Au plating solution into consideration, the thickness should preferably be restrained to a thickness of not greater than 0.05 µm. The metal line of this embodiment, of which the total thickness is reduced and the difference in level is accordingly reduced, can be adopted as signal lines and scanning lines inside the LCD panel.

In a metal line of another embodiment, the plating films have a total thickness z of 0.2 µm$\leq$z$\leq$1 µm.

In this embodiment, the total thickness z of the Cu/Au/Ni plating film or the Cu/Ni plating film was set to a thickness of not smaller than 0.2 µm. Therefore, the thickness of the Cu film can be secured to a thickness of 0.1 µm when the Ni film has the smallest thickness of 0.1 µm. Therefore, the minimum electric characteristic (sheet resistance) of the electric interconnecting line can be secured.

Since the total thickness of the Cu/Au/Ni plating film or the Cu/Ni plating film is set to a thickness of not greater than 1 µm, the influence of the stepped portions of the bus lines exerted on the state of alignment of the liquid crystal layer can be eliminated even when the plating film is used for the bus lines of the LCD. Furthermore, even when a device structure in which other interconnecting lines extend across the bus lines is provided, the probability of the occurrence of the disconnection of the interconnecting lines of the upper layer in the stepped portions can be reduced.

One embodiment is a display device employing the metal line for at least one of a scanning line and a signal line.

According to the display device of this embodiment, the bus lines (scanning lines and signal lines) can be formed by means of an inexpensive apparatus without the need of any vacuum film forming apparatus. The film formation by electroless plating is adopted, and therefore, a film of a uniform thickness can be easily formed even on a large-area substrate. In general, the Cu film has the problem that it is hard to be dry-etched and that improvement in etching accuracy is hard to achieve in the case of the wet etching. According to the metal line of the present invention, a Cu film can be selectively formed on the groundwork Ni film pattern (or an Au/Ni pattern). Therefore, no patterning (etching) of the Cu film is needed, and this allows Cu interconnection to be easily achieved.

Therefore, according to this embodiment, a display device that is allowed to have improved performances by virtue of the adopted Cu interconnection can be provided at a low fabricating cost.

Another embodiment is a thin film transistor having a structure in which the metal line is employed as a gate electrode, and a gate insulating film, a semiconductor film and source and drain electrodes are successively formed on the gate electrode.

One embodiment is an active matrix type display device comprising the thin film transistor.

According to the active matrix type display device of this embodiment, the TFT elements to be used for the display device can be fabricated at low cost, and further the display device that has the active matrix substrate employing the TFT elements can be fabricated at low cost, similarly to the above display device.

One embodiment is a display device, wherein a driver LSI is mounted in a chip-on-glass manner on a glass substrate that constitutes part of the display device, and the metal line is employed as input and output lines of the driver LSI formed on the glass substrate.

According to the display device of the embodiment, the aforementioned metal line is employed as a driver input and output line. With this arrangement, the driver input and output line is allowed to have a reduced resistance in correspondence with the necessity of the reduction in resistance of the driver input and output line formed in the vicinity of the display device in accordance with the increase in area of the display device.

One embodiment is a metal line fabricating method comprising at least the steps of:

forming an oxide film having a specified interconnecting line shape on an insulating substrate;

selectively providing a plating catalyst on the oxide film; and selectively forming the metal line into a film on the oxide film.

According to the fabricating method of the embodiment, the plating catalyst of Pd (palladium) or the like is selectively provided only on the oxide film wherein the pattern of the oxide film (ITO film, as a representative example) is formed on the insulating substrate such as a glass substrate. As a result, the metal line mentioned in the above can be selectively formed only on the oxide film. Therefore, if the groundwork oxide film is patterned into the specified interconnecting line shape, then there is no need for patterning the plating film, and the metal lines can be simply obtained.

One embodiment is a metal line fabricating method comprising at least the steps of:

coating a photosensitive material containing a plating catalyst on an insulating substrate;

depositing the plating catalyst into a specified interconnecting line shape by irradiation of light or ultraviolet rays on the photosensitive material; and selectively forming the metal line into a film in a region where the catalyst is deposited.

According to the embodiment, by coating the photosensitive material that contains the plating catalyst on the insulating substrate such as a glass substrate and making the plating catalyst deposit into the specified interconnecting line shape by the irradiation of light or ultraviolet rays, the plating catalyst of Pd (palladium) or the like can be selectively deposited in a specified position on the insulating substrate. As a result, the metal line mentioned in the above can be selectively formed only in the region where the catalyst is provided. Therefore, if the groundwork catalyst is patterned into the specified interconnecting line shape, then there is no need for patterning the plating film, and the metal lines can be simply obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of the present invention will be described below with reference to the drawings.

Figure 1A:
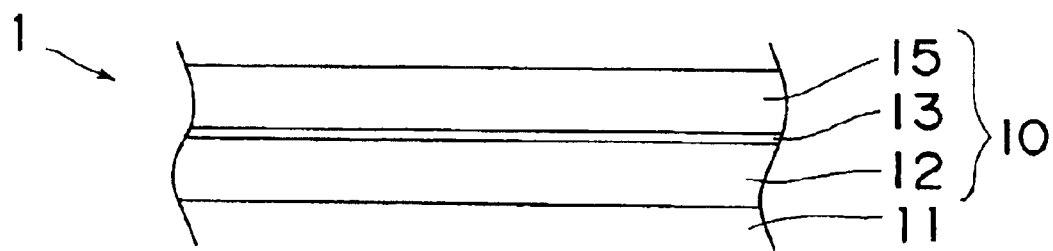
FIG. 1A is a sectional view of the structure of a first embodiment of a metal line of the present invention.

FIG. 1A shows the cross section structure of a first embodiment of a metal line of the present invention. The metal line 1 of this first embodiment is constructed of a Cu/Au/Ni laminate film 10 by electroless plating. This Cu/Au/Ni laminate film 10 is constructed of an electroless Ni plating film 12, an electroless (substitution) Au plating film 13 and an electroless Cu plating film 15, which are successively formed on a groundwork layer 11.

Figure 1B:
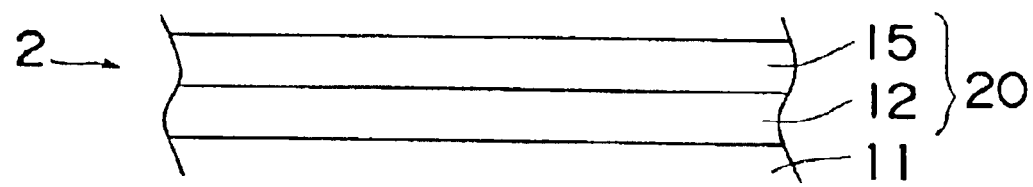
FIG. 1B is a sectional view of the structure of a second embodiment of a metal line of the present invention.

FIG. 1B shows the cross section structure of a metal line of a second embodiment. The metal line 2 of this second embodiment is constructed of a Cu/Ni laminate film 20. This Cu/Ni laminate film 20 is constructed of an electroless Ni plating film 12 and an electroless Cu plating film 15 which are successively formed on a groundwork layer 11.

In the first and second embodiments, the phosphorus content x of the Ni film 12 is 10 wt %$\leq x \leq$15 wt %.

In the case of the general electroless Ni plating that employs hypophosphite as a reductant, the resulting deposit film generally becomes an eutectoid film of Ni (nickel) and P (phosphorus). However, it was discovered through experiments described later that the so-called high phosphorus content type Ni film 12 having a phosphorus content x of 10 to 15 percent by weight was formed into a fine smooth film under the condition of a film thickness of 0.1 $\mu$m or greater. This is presumably ascribed to the fact that the Ni film 12 is deposited in an amorphous state when the phosphorus content x becomes equal to or greater than eight percent by weight and consequently pinholes are hard to occur at the crystal grain boundaries. It is to be noted that the film quality is not good when the film thickness is smaller than 0.1 $\mu$m since the sparse state of the Ni film becomes significant. Then, the defect of blistering as observed in the conventional case scarcely occurred if the Cu film 15 or the Cu and Au films 13 and 15 were formed on the obtained Ni film 12.

Therefore, employing the Ni film 12 of the present structure enabled the formation of a plating film of the Cu/Ni structure shown in FIG. 1B or the Cu/Au/Ni structure shown in FIG. 1A with the Ni film 12 of a thickness smaller than 0.4 $\mu$m and facilitated the reduction in the total plating thickness.

According to the metal line 1 of the Cu/Au/Ni structure shown in FIG. 1A, the Au film 13 has a thickness y of 0.005 $\mu$m$\leq y \leq$0.05 $\mu$m. This metal line 1 employs the high phosphorus content type Ni film 12 as described hereinabove, and therefore, a fine Ni film 12 having a smooth surface can be obtained. Therefore, the Au film 13 to be formed on this Ni film 12 was reduced in thickness to a minimum of 0.005 $\mu$m. It is otherwise possible to set the Au film to a thickness of 0.05 $\mu$m or greater taking a process margin into consideration. However, taking the cost of an Au plating solution into consideration, the thickness should preferably be restrained to a thickness of not greater than 0.05 $\mu$m. This metal line 1, of which the total thickness is reduced and the difference in level is accordingly reduced, can be adopted as signal lines and scanning lines inside the LCD panel.

Experiments on which the present invention and the embodiments thereof are based will now be described below.

It is generally known that the electroless Ni film employing hypophosphite as a reductant has 2 to 15 percent by weight of eutectoid phosphorus depending on the composition of the plating solution and the plating conditions.

Accordingly, a plurality of Ni films of a varied phosphorus content was formed by means of various Ni plating baths using hypophosphite as a reductant. Then, the states of the surfaces of the plurality of Ni films were observed by AFM (Atomic Force Microscope) for comparison between the states of the occurrence of pinholes that caused the defect of blistering in the Ni film. As a result, it was discovered that the high phosphorus content type Ni film having a phosphorus content of 10 to 15 percent by weight in the Ni film had a fine smooth film state by comparison with the medium phosphorus content type Ni film having a phosphorus content of 5 to 8 percent by weight in the Ni film. It was also discovered that the high phosphorus content type Ni film having a phosphorus content of 10 to 15 percent by weight was able to obtain a fine film if the Ni film thickness is reduced to a thickness of 0.1 $\mu$m. It was observed that a Ni film became sparse with rapidly increased pinholes when the thickness of the Ni film became smaller than 0.1 $\mu$m even though the high phosphorus content type Ni film having a phosphorus content of 10 to 15 percent by weight was employed.

Next, with three types of representative Ni films of a varied phosphorus content, the state of the occurrence of the defect of blistering was observed depending on when the Ni film was plated with a Cu film and when the Ni film was plated with a Cu/Au film. The results are shown in Table 1 and Table 2.

TABLE 1

Relation between Phosphorus Content and Defect of Blistering in Cu/Ni Plating Film Forming Stage

|  | Low Phosphorus Content Type | Medium Phosphorus Content Type | High Phosphorus Content Type |
| --- | --- | --- | --- |
| Phosphorus Content (wt %) in Ni Film | 2–4 | 5–8 | 10–15 |
| Surface State of Ni Plating Film (Condition) Ni Film Thickness of 0.2 $\mu$m | Many Pinholes | Many Pinholes | Fine |
| Occurrence of Defect of Blistering after Cu Plating (Condition) Cu Film Thickness of 0.2 $\mu$m | Frequent Occurrence | Frequent Occurrence | Rare |

TABLE 2

Relation between Phosphorus Content and Defect of Blistering in Cu/Au/Ni Plating Film Forming Stage

|  | Low Phosphorus Content Type | Medium Phosphorus Content Type | High Phosphorus Content Type |
| --- | --- | --- | --- |
| Phosphorus Content (wt %) in Ni Film | 2–4 | 5–8 | 10–15 |
| Surface State of Ni Plating Film (Condition) Ni Film Thickness of 0.2 $\mu$m | Many Pinholes | Many Pinholes | Fine |
| Occurrence of Defect of Blistering after Cu Plating (Condition) Au Film Thickness of 0.01 $\mu$m Cu Film Thickness of 0.2 $\mu$m | Frequent Occurrence | Frequent Occurrence | No Occurrence |

As described above, it was discovered that the defect of blistering was able to be remarkably improved in the Cu/Ni laminate film structure and the Cu/Au/Ni laminate film structure by employing the high phosphorus content type Ni film having a phosphorus content of 10 to 15 percent by weight in the Ni film. The fine structure of the high phosphorus content type Ni film having a phosphorus content of 10 to 15 percent by weight is presumably ascribed to the fact that the Ni film is deposited in an amorphous state when the phosphorus content is not smaller than 8 or 10 percent by weight and consequently gaps are hard to occur between the crystal grains. Further, the fine structure of the high phosphorus content type Ni film is presumably ascribed to the fact that a relatively small internal stress is observed in the Ni film having a phosphorus content of not smaller than seven percent by weight and the fact that a fine film can be easily obtained since the deposition rate of the plating film is reduced when a plating bath having a high phosphorus content is used.

It is to be noted that the demerits of an increase in the internal stress of the Ni film and the significant deterioration of the Au substitution plating rate in the next stage occur when the phosphorus content exceeds 15 percent by weight in the Ni film. Therefore, the upper limit of the phosphorus content in the Ni film is set to 15 percent by weight.

The phosphorus content in the deposited Ni film is largely influenced by pH, reductant concentration, temperature and so on during the plating process, and therefore, it is preferable to secure a process margin by setting the phosphorus content to 11 to 13 percent by weight in the Ni film.

In the case of the Cu/Au/Ni laminate film structure, the surface of the Ni film is plated with substitution Au plating and thereafter plated with electroless Cu plating for the purposes of plugging the pinholes existing in the surface of the Ni film and preventing the oxidation of the surface of the Ni film. According to this construction, only minute pinholes exist in the Ni film when the high phosphorus content type Ni film having a phosphorus content of 10 to 15 percent by weight in the Ni film is employed. Therefore, it was confirmed that even the substitution Au plating formed to a thickness of 0.005 $\mu$m at minimum produced sufficient effects as a countermeasure against the defect of blistering. The Au plating film may have a thickness of 0.05 $\mu$m or greater taking the process margin into consideration. However, taking the high cost of the Au plating solution into consideration, the Au thickness should preferably be restrained to 0.05 μm or a smaller value. Preferably, it is proper to set the thickness to 0.01 to 0.02 μm.

Concrete examples of the metal line fabricating method of the present invention will now be described below.

(First Example)

Figure 2:
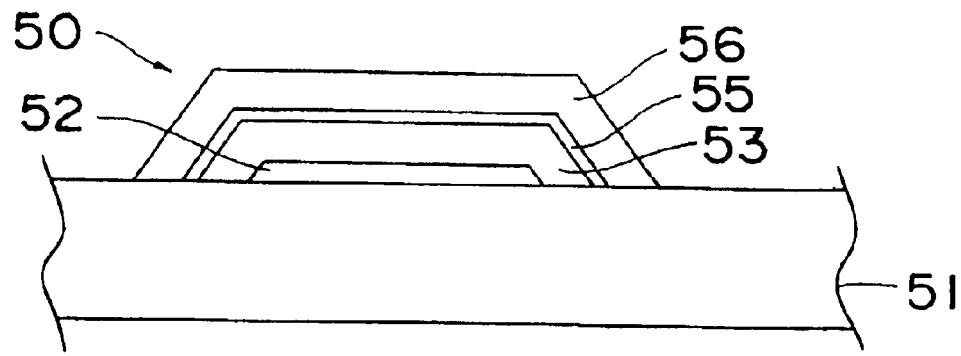
FIG. 2 is a sectional view of the structure of a metal line fabricated by a first example of a metal line fabricating method of the present invention.

FIG. 2 is a sectional view of the structure of a metal line 50 fabricated according to a first example of the metal line fabricating method of the present invention. According to the metal line 50 fabricated by this first example, a Cu/Au/Ni laminate film 53, 55, 56 is formed by selective electroless plating on an ITO film 52 formed into a pattern on a glass substrate 51 that serves as an insulating substrate. The procedure of formation is described below.

(First Process)

First, a surface of a glass substrate (#1737 produced by Corning Corp.) 51 is cleaned for defatting by means of an alkali, an acid or an organic solvent. In this stage, it is effective to use ultrasonic cleaning together. Then, the ITO film 52 is formed as an interconnecting line groundwork layer to a thickness of about 0.05 μm on the surface of the glass substrate 51 by the spattering deposition method, the EB (Electron Beam) deposition method, the sol-gel method and the like. This interconnecting line groundwork layer is not limited to the ITO film 52 and is allowed to be provided by another oxide film of $SnO_2$ or the like. Then, the ITO film 52 is patterned into a specified interconnecting line shape.

This patterning is generally performed by forming a resist of a specified pattern on the ITO film 52 by the technique of photolithography or the like and removing the unnecessary ITO film by wet etching or dry etching. For example, an HBr or ferric chloride aqueous solution can be used for the etching of ITO. Furthermore, (zinc catalyst) +(hydrochloric acid) can be used for the etching of $SnO_2$.

(Second Process)

Next, a plating catalyst is selectively provided on the patterned ITO film (interconnecting line groundwork layer) 52. According to the general method, the surface of the ITO film 52 is slightly roughened by a fluoride containing solution. Subsequently, by performing an activating process by immersing it in a palladium (Pd) chloride solution, a Pd catalyst that becomes the catalyst of electroless plating is deposited only on the ITO film 52.

If a catalyst donor availed on the market is used, it is proper to dilute, for example, an emplate activator 440 produced by Meltex Inc. at a ratio of 30 mL/L, control its solution to pH 5.5 by a KOH aqueous solution of 1N, immerse the substrate 51 provided with the pattern of the ITO film 52 in the solution for about five minutes and thereafter wash the substrate 51 with pure water.

(Third Process)

Next, an Ni film 53 is selectively formed by electroless plating only on the ITO film 52 to which the Pd catalyst has been given in the preceding process. Specifically, the Ni film 53 is formed to a thickness of about 0.2 μm by means of an electroless Ni plating solution comprised principally of an Ni salt compound, a complexing agent and a reductant (hypophosphite). Through this process, the Ni film 53 is selectively formed only on the pattern of the ITO film 52. In this stage, a plating bath such that the deposited Ni film 53 has phosphorus content of 10 to 15 percent by weight is selected and used. A fine Ni film 53 having a phosphorus content of about 12% is deposited to a thickness of about 0.2 μm by using, for example, Melplate ITO NI-866 produced by Meltex Inc., controlling its solution to a temperature of 70° C. and pH 4.5 and immersing the substrate 51 provided with the pattern of the ITO film 52 in the solution for about seven minutes. Subsequently, in order to improve the adhesion property of the Ni film 53, an annealing process is carried out for 30 minutes at a temperature of 250 to 270° C. This annealing process may be performed after Au plating in the next process.

(Fourth Process)

Next, Au, which is an anti-corrosion metal, is formed to a thickness of 0.02 μm by displacement plating on the surface of the Ni film 53 obtained in the preceding process. A substitution Au film 55 is deposited to a thickness of about 0.01 μm by using, for example, Melplate AU-601 produced by Meltex Inc., controlling its solution to a temperature of 90° C. and pH 4.5 and immersing the substrate 51 provided with the pattern of the Ni film 53 in the solution for about five minutes.

(Fifth Process)

Finally, a Cu film 56 is selectively formed to a thickness of 0.2 μm only on the Au film 55 by electroless plating. In this stage, the electroless Cu plating can be selectively formed on the Au film 55 with the groundwork Au film 55 used as a catalyst. A Cu film 56 is deposited to a thickness of about 0.2 μm by using, for example, Melplate CU-390 produced by Meltex Inc., controlling its solution to a temperature of 40° C. and pH 13.5 and immersing the substrate 51 provided with the pattern of the Au/Ni films 55 and 53 in the solution for about 50 minutes.

The metal lines formed by the aforementioned First Process through the Fifth Process exhibited a good adhesion property, and no defect of blistering occurred. There can be provided a metal line, which has a total plating film thickness of 0.4 μm or 0.45 μm inclusive of the ITO film 52 i.e. the interconnecting line groundwork layer, the thickness being much smaller than that of the conventional Cu/Au/Ni/ITO interconnecting line. Furthermore, this metal line has a sheet resistance of about 0.15 Ω/□, which can be sufficiently used for the bus lines (scanning lines and signal lines) of the display device.

(Second Example)

Figure 3:
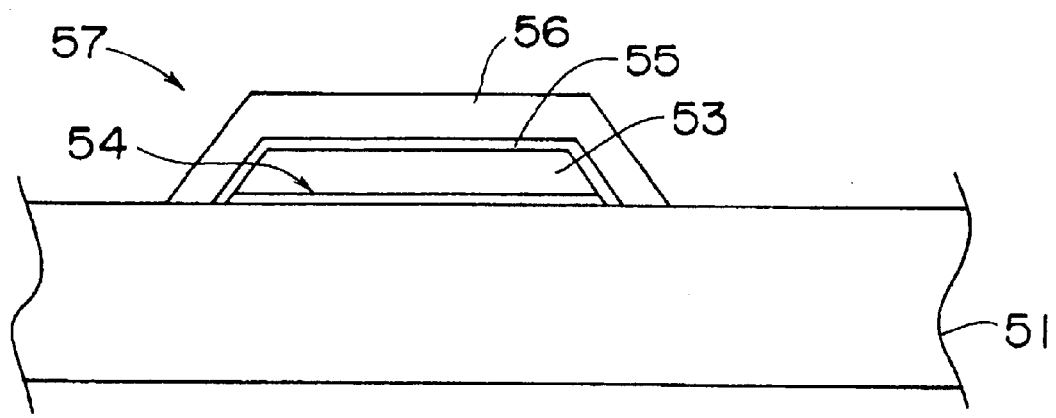
FIG. 3 is a sectional view of the structure of a metal line fabricated by a second example of the metal line fabricating method of the present invention.

According to the fabricating method of this second example shown in FIG. 3, a metal line 57 is produced by using the method of eliminating the interconnecting line groundwork layer (ITO film 52 and $SnO_2$ film) formed in the First Process from the metal line fabricating process mentioned in connection with the aforementioned first embodiment and selectively arranging a Pd catalytic layer 54 in a specified interconnecting line shape directly on a glass substrate 51.

As a catalyst to be arranged in the specified interconnecting line shape on the glass substrate 51, there can be employed a photosensitive material containing, for example, a metal that serves as a catalyst, a compound thereof, ions, colloid or the like. Specifically, a material obtained by dissolving palladium acetylacetonato in an organic solvent of chloroform or the like is employed. If this photosensitive catalyst solution is coated on the glass substrate 51 by the spin method or the like and subjected to the irradiation of ultraviolet rays via a photomask, then a metal Pd (palladium) is deposited only in the exposed area on the glass substrate 51. Subsequently, the photosensitive film located in the area that has not been exposed is washed away by the organic solvent such as chloroform in a development process, through which a photosensitive catalytic layer 54 constructed of the pattern of the left Pd is formed.

Besides this, it is possible to use a photosensitive catalyst solution obtained by dissolving ferric oxalate and palladium chloride in a potassium hydroxide solution or a photosensitive catalyst solution that contains an oxalate such as ferric oxalate or ruthenium oxalate, palladium chloride and aqua ammonia. In this case, it is also effective to add a hydrophilic binder like, for example, polyvinyl alcohol to the aforementioned photosensitive catalyst solution so as to allow uniform coating of the photosensitive catalyst solution on the substrate to be easily achieved. There is a further method for selectively depositing Ag by utilizing the reductive reaction of Ag ions by the irradiation of ultraviolet rays.

It is also possible to improve the adhesion property of the plating film in the subsequent process by slightly roughening the surface of the glass substrate 51 with a fluoride containing solution as the need arises before the catalyst providing process. Furthermore, it is also possible to satisfactorily retain the palladium nuclei as the catalyst by forming a coating film on the surface of the glass substrate 51 through immersion in an aqueous solution that contains an amino compound.

By thus forming the catalyst pattern 54 on the glass substrate 51 using the photosensitive catalyst solution and providing the plating of the Cu/Au/Ni laminate films 56, 55 and 53 similarly to the first embodiment, a metal line 57 (third embodiment) shown in FIG. 3 is formed.

The obtained metal line 57 has characteristics similar to those of the metal line (FIG. 2) fabricated by the fabricating method of the first embodiment and is able to be sufficiently used as the bus lines (scanning lines and signal lines) of the display device.

By selectively arranging the plating catalyst having photosensitivity into a specified pattern as in the second embodiment, a metal line can be fabricated through simpler processes without the formation of the interconnecting line groundwork layer such as an ITO film. Furthermore, because of the needlessness of the interconnecting line groundwork layer, there is the advantage that a metal line having a small total thickness can be formed at low cost.

(Third Example)

Figure 4:
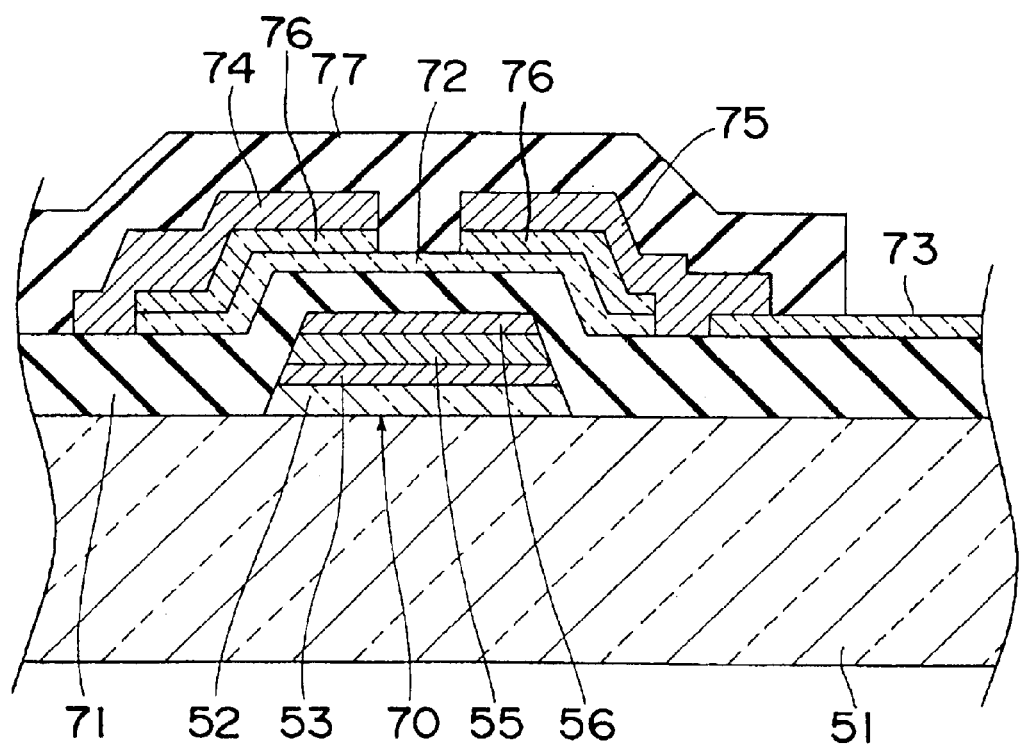
FIG. 4 is a sectional view of the structure of a thin film transistor (TFT) according to a third example of the present invention.

Next, FIG. 4 shows a sectional structure of a thin film transistor (TFT) in the case where the metal line 50 (See FIG. 2) fabricated in the first example is used for an active matrix substrate, as an example.

As shown in FIG. 4, a gate line 70 constituted by the metal line 50 is constructed of a laminate film of an ITO film 52 (thickness: 0.05 $\mu$m) that serves as an interconnecting line groundwork layer and is formed on a glass substrate 51, an Ni film 53 (thickness: 0.2 $\mu$m), an Au film 55 (thickness: 0.01 $\mu$m) and a Cu film 56 (thickness: 0.2 $\mu$m). The sheet resistance of this laminate film is 0.15 $\Omega/\square$. A gate insulating film 71 made of SiNx is formed on the gate line 70 by CVD method. There are further formed on the above film 71 an a-Si film that constitutes a channel layer 72, an n$^+$ type a-Si film that serves as a contact layer 76, a source electrode 74 made of Al, a drain electrode 75 made of Al, a pixel electrode 73 made of ITO and an insulative protecting film 77 made of SiNx.

It was able to be confirmed that the thus-obtained TFT element exhibited characteristics almost similar to those of the conventional TFT element that employed the gate line formed only by dry film forming. That is, it was able to be confirmed that the present invention could be applied to an active matrix drive type LCD.

Although the TFT of the reverse stagger structure (bottom gate structure) has been described herein, the present invention may also be applied to the TFT of the stagger structure (top gate structure). Without being limited to TFTs, the present invention can constitute other nonlinear elements such as a two-terminal diode.

The aforementioned TFT is an example of the application of the metal line fabricated according to the first example. However, the present invention is not limited to this, and it is, of course, acceptable to employ the metal line 57 (See FIG. 3) fabricated by the second example.

Figure 5A:
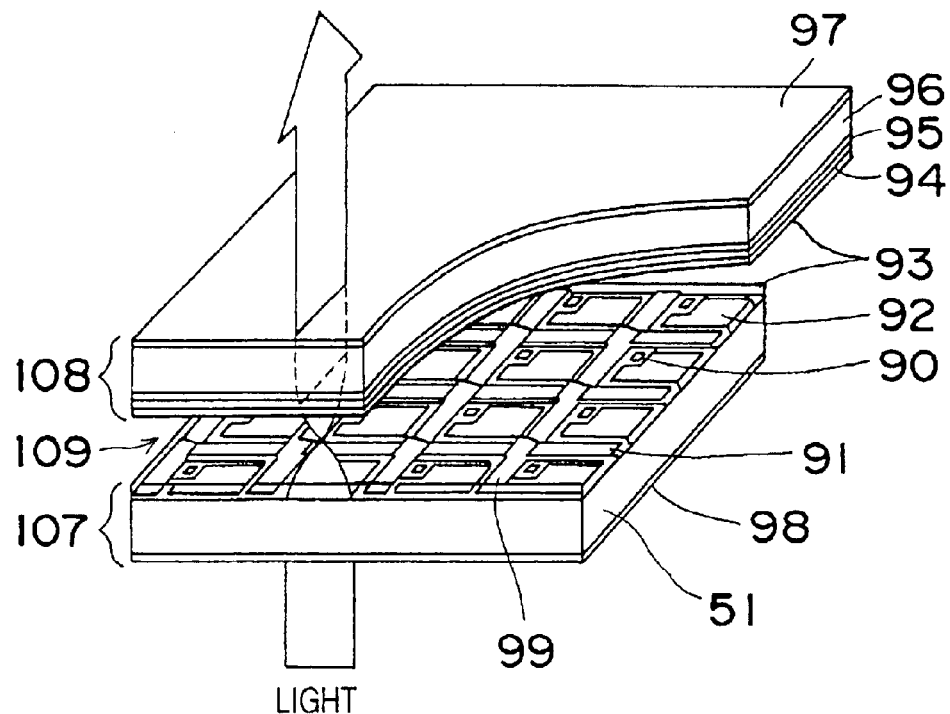
FIG. 5A is a schematic view of an active matrix type LCD having the structure of the third example.
Figure 5B:
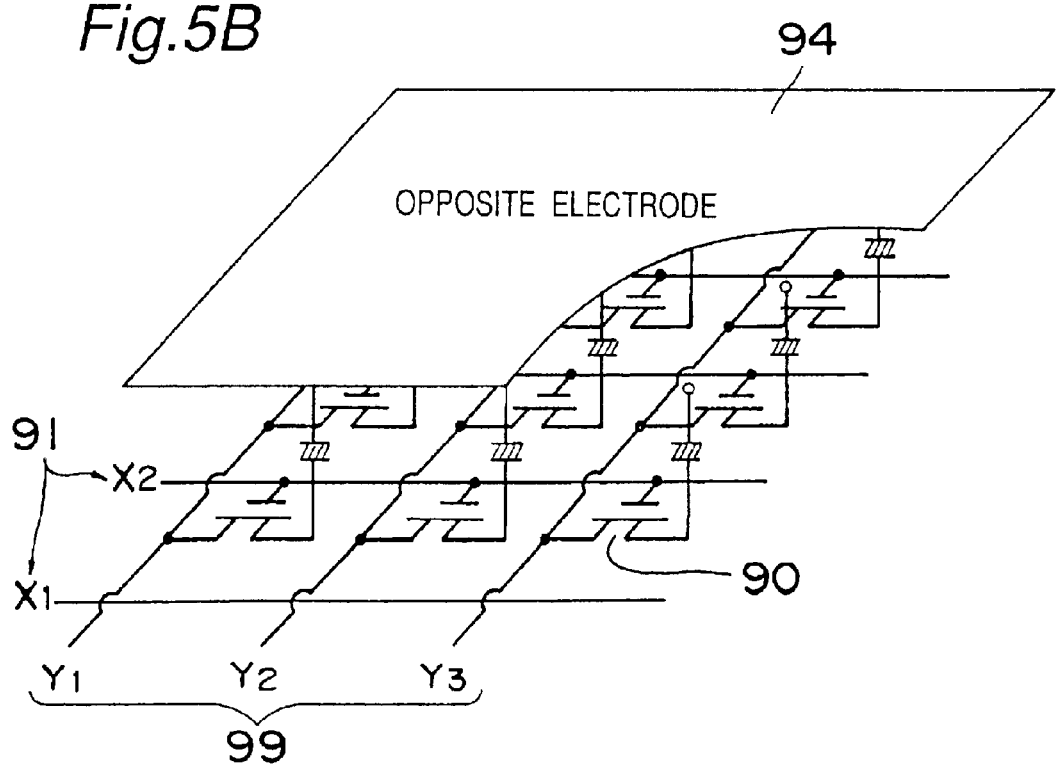
FIG. 5B is an equivalent circuit diagram of the above active matrix type LCD.

Next, a liquid crystal display (LCD) was formed by using the active matrix substrate that had the TFT element shown in FIG. 4. This active matrix type LCD is schematically shown in FIGS. 5A and 5B. As a result, an LCD that had a display performance similar to that of the conventional one was able to be provided.

As shown in FIG. 5A, this active matrix type LCD has a structure in which liquid crystals 109 that are electrooptic media are interposed between an active matrix substrate 107 and an opposite substrate 108. The active matrix substrate 107 includes a plurality of active elements (TFTs) 90 arranged in a matrix form on a glass substrate 51, pixel electrodes 92 arranged adjacent to the TFTs 90, scanning lines (scanning electrodes) 91 and signal lines (data electrodes) 99 that extend vertically and horizontally between these pixel electrodes 92, 92, . . . and an alignment film 93 arranged on top of these members. On the other hand, the opposite substrate 108 includes a glass substrate 96, and provides a color filter (RGB) 95, an opposite electrode (ITO) 94 and an alignment film 93 on the glass substrate 96. Both the substrates 107 and 108 are arranged so that the alignment films 93 face each other as illustrated, and a gap between both the substrates 107 and 108 is filled with the liquid crystals 109. Outside both the substrates 107 and 108 are arranged polarizing plates 97 and 98. FIG. 5B shows an equivalent circuit of the active matrix type LCD shown in FIG. 5A.

(Fourth Example)

The fourth example of the present invention is described next referring to FIGS. 6 and 7. This fourth example is an example in which the metal line 50 shown in FIG. 2 fabricated according to the first example is applied to the reduction in resistance of the peripheral terminal portions of a passive matrix type LCD.

Lately, the COG (chip on glass) mounting is increasingly introduced as a method for mounting a drive LSI on an LCD panel. In this case, as shown in FIG. 6, it is required to provide driver I/O lines 85 for driver LSI chips 83, 83, . . . mounted in peripheral portions 82 of an LCD panel substrate 81.

However, in the case of the passive matrix type LCD, the lines 85 on the substrate 81 are formed of an ITO film that generally has an electric resistance higher than that of a metal film. Therefore, signal delay in the lines 85 emerges as a more serious problem according as the lines 85 in the vicinity of the LSI chips 83, 83, . . . become more minute and longer. Therefore, if the LCD is increased in area, then the driver I/O lines 85 formed in the vicinity of the LCD panel 81 are required to have a low resistance.

Figure 6:
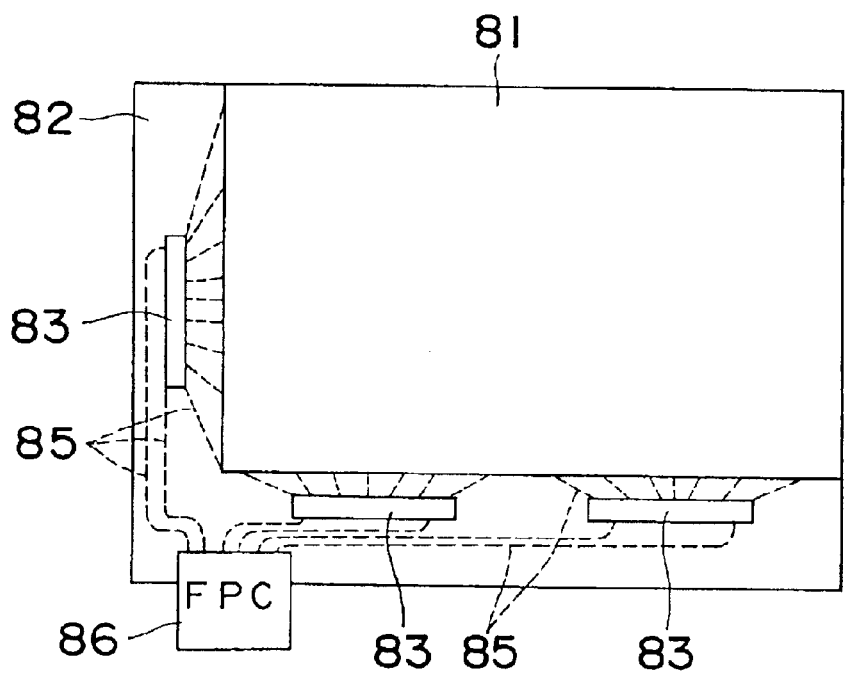
FIG. 6 is a schematic view of a passive matrix type LCD.
Figure 7:
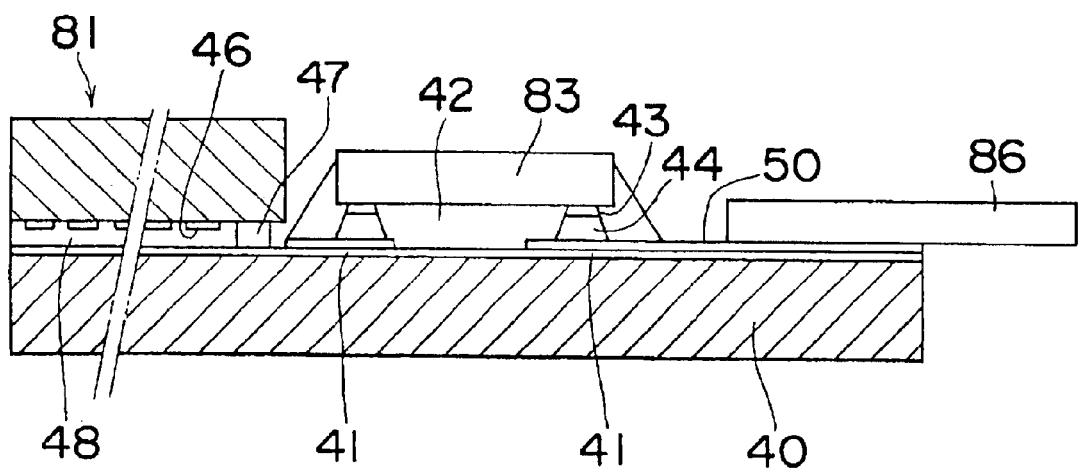
FIG. 7 is a sectional view of a passive matrix type LCD according to a fourth example of the present invention.
Figure 8:
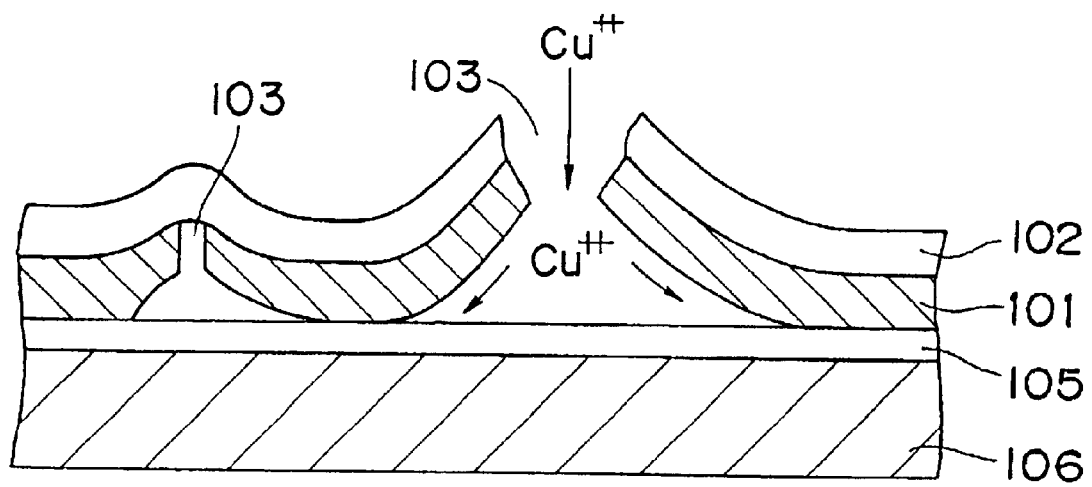
FIG. 8 is a schematic sectional view of the defect of blistering that occurs when performing direct Cu plating on an Ni film in a prior art example.

In response to these requirements, as shown in FIG. 7 that is a sectional view of FIG. 6, a low resistance can easily be achieved by laminating the metal lines 50 that are constructed of the Cu/Au/Ni metal films and fabricated according to the aforementioned first example on an ITO interconnecting line film 41 of the driver I/O lines 85 provided in the vicinity of the peripheral portions 82 of the LCD panel 81. In FIG. 7 are shown the LCD panel 81, an insulating resin 42, protruding electrodes 43, a conductive bond 44, a scanning line 46 made of ITO (indium tin oxide), liquid crystals 48 and a liquid crystal seal 47. The reference numeral 86 denotes an FPC (flexible printed circuit).

This fourth example has been described on the basis of the passive matrix type LCD. However, the present invention is not limited to this and is, of course, able to be broadly used for the applications of ITO interconnecting lines and other metal lines, which require a reduction in resistance.

As described above, the metal line of the present invention is effective when Cu is required to be used for a reduction in resistance in a flat-panel display device such as a liquid crystal display (LCD), a field emission display (FED), an electrophoretic display (EPD), a plasma display (PDP), an electrochromic display (ECD) and an electroluminescent display (ELD). Also, the metal line of the present invention becomes an interconnecting line that has a small thickness and excellent electric characteristics and is easy to be fabricated.

The present invention is extremely effective when an interconnecting line is required to be formed by wet type film formation instead of dry type film formation or when an increase in display area is required. The present invention is not limited to the metal line fabricating method for the flat panel display and is able to be widely applied as a method for fabricating a metal line for an active matrix substrate to be used for the flat panel type image sensor and in other fields.

As is apparent from the above, according to the metal line of the present invention, in the metal line having the structure in which the Cu film or the Cu/Au film is laminated by electroless plating on the Ni film formed by electroless plating, the phosphorus content x of the Ni film is 10 wt % $\leq$ x $\leq$ 15 wt %, and wherein the Ni film has a film thickness of 0.1 $\mu$m or greater.

According to the present invention, it was discovered through experiments that the so-called high phosphorus content type Ni film having an Ni film phosphorus content x of 10 to 15 percent by weight was formed into a fine smooth film under the condition of a film thickness of not smaller than 0.1 $\mu$m. Then, the defect of blistering as observed in the conventional case scarcely occurred if the Cu film or the Cu/Au film was formed on the obtained Ni film. Therefore, employing the Ni film of the present structure enabled the formation of a plating film of the Cu/Ni structure or the Cu/Au/Ni structure with the Ni film of a thickness smaller than 0.4 $\mu$m and facilitated the reduction in the total plating thickness.

The metal line of one embodiment employs the high phosphorus content type Ni film mentioned in the above, and therefore, a fine Ni film having a smooth surface can be obtained. Therefore, the Au film to be formed on this Ni film was reduced in thickness to a minimum of 0.005 $\mu$m. Taking the cost of an Au plating solution into consideration, the thickness should preferably be restrained to a thickness of not greater than 0.05 $\mu$m. The metal line of the embodiment, of which the total thickness is reduced and the difference in level is accordingly reduced, can be adopted as signal lines and scanning lines inside the LCD panel.

According to the metal line of one embodiment, the total thickness z of the Cu/Au/Ni plating film or the Cu/Ni plating film is set to a thickness of not smaller than 0.2 $\mu$m. Therefore, the thickness of the Cu film or the Cu/Au film can be secured to a thickness of 0.1 $\mu$m when the Ni film has the smallest thickness of 0.1 $\mu$m. Therefore, the minimum electric characteristic (sheet resistance value) of the electric interconnecting line can be secured. Since the total thickness of the Cu/Au/Ni plating film or the Cu/Ni plating film is set to a thickness of not greater than 1 $\mu$m, the influence of the stepped portions of the bus lines exerted on the state of alignment of the liquid crystal layer can be eliminated even when the plating film is used for the bus lines of the LCD. Furthermore, even when the device structure in which other interconnecting lines extend across the bus lines is employed, the probability of the occurrence of the disconnection of the interconnecting lines of the upper layer in the stepped portions can be reduced.

The display device of one embodiment employs the metal line mentioned in the above for the scanning lines or the signal lines. Therefore, according to the embodiment, the bus lines (scanning lines and signal lines) can be formed by means of an inexpensive apparatus without the need of any vacuum film forming apparatus. The film formation by electroless plating is adopted, and therefore, a film of a uniform thickness can be easily formed even on a large-area substrate. The metal lines mentioned in the above are able to selectively form a Cu film on the groundwork Ni film pattern (or Au/Ni pattern). Therefore, no patterning (etching) of the Cu film is needed, and this allows Cu interconnection to be easily achieved. Therefore, according to this embodiment, a display device that is allowed to have an improved performance with the employed Cu interconnection can be provided at low fabricating cost.

The thin film transistor of one embodiment has the structure in which the metal line mentioned in the above is employed as the gate electrode, and the gate insulating film, the semiconductor film and the source and drain electrodes are successively formed on the metal electrode.

The active matrix type display device of one embodiment includes the thin film transistor mentioned in the above. Therefore, according to the embodiment, the TFT element to be used for the display device can be fabricated at low cost, and the display device that has the active matrix type substrate employing the TFT element can be fabricated at low cost, similarly to the display device.

According to the display device of one embodiment, the metal line mentioned in the above is employed as the driver input and output lines. Therefore, the driver input and output lines are allowed to easily have a low resistance to cope with an increase in area of the display device.

According to the metal line fabricating method of one embodiment, the plating catalyst of Pd or the like is selectively provided only on the oxide film wherein the pattern of the oxide film (ITO film, as a representative example) is formed on the glass substrate. As a result, the metal line mentioned in the above can be selectively formed only on the oxide film. Therefore, if the groundwork oxide film is patterned into the specified interconnecting line shape, then there is no need for patterning the plating film, and the metal lines can be simply obtained.

According to the metal line fabricating method of one embodiment, by coating the photosensitive material that contains the plating catalyst on the glass substrate and making the plating catalyst deposit into the specified interconnecting line shape by the irradiation of light or ultraviolet rays, the plating catalyst of Pd (palladium) or the like can be selectively deposited in the specified position on the glass substrate. As a result, the metal line mentioned in the above can be selectively formed only in the region where the catalyst is provided. Therefore, if the groundwork catalyst is patterned into the specified interconnecting line shape, then there is no need for patterning the plating film, and the metal lines can be simply obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A metal line having a laminated film structure in which a gold film is disposed between a copper film and a nickel film wherein each of the copper and gold films is formed by electroless plating on the nickel film which is formed on a substrate by electroless plating, wherein the nickel film has a phosphorus content x of:
10 wt % $\leq$ x $\leq$ 15 wt %;
the nickel film has a film thickness of 0.1 $\mu$m or greater; and
the laminate film structure has a thickness, z, of:
0.2 $\mu$m $\leq$ z $\leq$ 1.0 $\mu$m.

2. A metal line as claimed in claim 1, wherein the gold film has a thickness y of:
0.005 $\mu$m $\leq$ y $\leq$ 0.05 $\mu$m.

3. A display device employing the metal line claimed in claim 1 for at least one of a scanning line and a signal line.

4. A thin film transistor having a structure in which the metal line claimed in claim 1 is employed as a gate electrode, and a gate insulating film, a semiconductor film and source and drain electrodes are successively formed on the gate electrode.

5. An active matrix type display device comprising the thin film transistor claimed in claim 4.

6. A display device, wherein a driver LSI is mounted in a chip-on-glass manner on a glass substrate that constitutes part of the display device, and the metal line claimed in claim 1 is employed as input and output lines of the driver LSI formed on the glass substrate.

7. A metal line fabricating method comprising at least the steps of:
forming an oxide film having a specified interconnecting line shape on an insulating substrate;
selectively providing a plating catalyst on the oxide film; and
selectively forming the metal line claimed in claim 1 into a film on the oxide film.

8. A metal line fabricating method comprising at least the steps of:
coating a photosensitive material containing a plating catalyst on an insulating substrate;
depositing the plating catalyst into a specified interconnecting line shape by irradiation of light or ultraviolet rays on the photosensitive material; and
selectively forming the metal line claimed in claim 1 into a film in a region where the catalyst is deposited.

9. A metal line having a laminated film structure comprising a copper film and a nickel film wherein the copper is formed by electroless plating on the nickel film which is formed on a substrate by electroless plating, wherein the nickel film has a phosphorus content x of:
10 wt % $\leq$ x $\leq$ 15 wt %;
the nickel film has a film thickness of 0.1 $\mu$m or greater; and
the laminated film structure has a total thickness z of:
0.2 $\mu$m $\leq$ z $\leq$ 1 $\mu$m.

10. A display device employing the metal line claimed in claim 9 for at least one of a scanning line and a signal line.

11. A thin film transistor having a structure in which the metal line claimed in claim 9 is employed as a gate electrode, and a gate insulating film, a semiconductor film and source and drain electrodes are successively formed on the gate electrode.

12. An active matrix type display device comprising the thin film transistor claimed in claim 11.

13. A display device, wherein a driver LSI is mounted in a chip-on-glass manner on a glass substrate that constitutes part of the display device, and the metal line claimed in claim 9 is employed as input and output lines of the driver LSI formed on the glass substrate.

14. A metal line fabricating method comprising at least the steps of:
forming an oxide film having a specified interconnecting line shape on an insulating substrate;
selectively providing a plating catalyst on the oxide film; and
selectively forming the metal line claimed in claim 9 into a film on the oxide film.

15. A metal line fabricating method comprising at least the steps of:
coating a photosensitive material containing a plating catalyst on an insulating substrate;
depositing the plating catalyst into a specified interconnecting line shape by irradiation of light or ultraviolet rays on the photosensitive material; and
selectively forming the metal line claimed in claim 9 into a film in a region where the catalyst is deposited.

* * * * *

UNITED STATES PATENT AND TRADEMARK OFFICE
CERTIFICATE OF CORRECTION

PATENT NO. : 6,770,978 B2
DATED : August 3, 2004
INVENTOR(S) : Yoshihiro Izumi et al.

It is certified that error appears in the above-identified patent and that said Letters Patent is hereby corrected as shown below:

<u>Title page,</u>
Item [73], Assignee, please add -- Meltex, Inc., Tokyo, Japan --

Signed and Sealed this

Seventh Day of June, 2005

JON W. DUDAS
*Director of the United States Patent and Trademark Office*